US006628147B2

(12) United States Patent
Dathe et al.

(10) Patent No.: US 6,628,147 B2
(45) Date of Patent: Sep. 30, 2003

(54) COMPARATOR HAVING REDUCED SENSITIVITY TO OFFSET VOLTAGE AND TIMING ERRORS

(75) Inventors: Lutz Dathe, Dresden (DE); Thorsten Riedel, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/185,129

(22) Filed: Jun. 27, 2002

(65) Prior Publication Data

US 2003/0090299 A1 May 15, 2003

(30) Foreign Application Priority Data

Nov. 15, 2001 (DE) .......................... 101 56 026

(51) Int. Cl.[7] .............................................. H03K 5/153
(52) U.S. Cl. ............................................. 327/74; 327/76
(58) Field of Search ................................ 327/72–79, 87, 327/89, 205, 206, 24, 26, 27, 31, 37, 142, 198

(56) References Cited

U.S. PATENT DOCUMENTS

| 4,588,905 | A | * | 5/1986 | Kojima | ...................... 327/72 |
| 5,819,165 | A | | 10/1998 | Hulkko et al. | |
| 5,880,614 | A | * | 3/1999 | Zinke et al. | ................. 327/206 |
| 5,995,011 | A | * | 11/1999 | Kurihara et al. | ............... 327/74 |
| 6,111,443 | A | * | 8/2000 | Mores et al. | ................. 327/206 |
| 6,130,539 | A | | 10/2000 | Pulak | |
| 6,274,869 | B1 | | 8/2001 | Butler | |

OTHER PUBLICATIONS

Lin et al., U.S. patent application Publication 2002/0,163, 373 published Nov. 07, 2002, Ser. No. 10/082,214 filed Feb. 26, 2002.*

* cited by examiner

*Primary Examiner*—Toan Tran
(74) *Attorney, Agent, or Firm*—Meyertons, Hood, Kivlin, Kowert, & Goetzel, P.C.; B. Noël Kivlin

(57) ABSTRACT

A comparator comprises a switching means for supplying two different threshold voltages to the comparator upon a first and a second control signal, respectively. The second control signal is enabled by a rising or a falling edge of the comparator output that is coupled to a control means providing the second control signal. The time interval that a varying input signal requires to change its amplitude crossing and in between the two threshold voltages can thus be detected by two subsequent rising or falling edges of the comparator output without the adverse influence of the comparator's meta-stability.

22 Claims, 2 Drawing Sheets

COMPARATOR HAVING REDUCED SENSITIVITY TO OFFSET VOLTAGE AND TIMING ERRORS

BACKGROUND OF THE INVENTION

1. Field of the Invention

The present invention relates to an electronic comparator device, more specifically to a window comparator, used to determine a time interval in which an input signal varies between a first threshold voltage and a second threshold voltage. Moreover, the present invention relates to a window comparator for determining an inherent time constant (RC constant) of an analog integrated circuit, such as an analog electronic filter circuit.

2. Background of the Invention

In many electronic applications an input signal having an amplitude that varies in time needs to be compared with a predefined threshold voltage, wherein an electronic device provides an output signal to indicate whether the input signal is higher or lower than the threshold voltage. Typically, a common operational amplifier without negative feedback, or especially designed amplifiers, so-called analog comparators, are used to detect the point in time when a varying input signal exceeds the predefined threshold value.

Any conventional analog comparator (hereinafter simply referred to as comparator), however, exhibits offset and timing errors, when no additional offset calibration, pre-charging and/or sampling architecture is provided. The offset error of the comparator is primarily caused by a static input offset voltage and a variable offset voltage that depends on the applied input voltage and the threshold voltage supplied to the comparator. The timing error of the comparator, i.e., the delay between the point in time when the input signal actually crosses the threshold voltage and the point in time when a change of the comparator's output finally indicates the crossover of the input signal and the threshold voltage, is caused by time delays of the electronic circuit, for example, by the rise and fall times of the output node(s) of the comparator, and a so-called meta-stability or hysteresis of the comparator that occurs for a small difference of the input signal and the threshold voltage. The range/time of the meta-stability also depends on the direction in which the input signal crosses the threshold voltage.

Comparators are frequently used in applications where an analog input signal is compared with a linearly varying threshold voltage to determine a time interval from a defined start value of the threshold voltage to the point in time when the threshold voltage equals the input signal. The time interval, for example determined by means of a counter that is triggered by the comparator output, may then be used as a digital measure for the analog signal, for instance in form of the counter value. Such a single slope measurement, however, will entrain a large conversion error due to the timing and offset errors described above. Accordingly, additional circuitry for obtaining precise results in a single slope measurement using a comparator is required, thereby contributing to circuit complexity and increasing of manufacturing cost.

An increased circuit complexity is even more disadvantageous when the comparator is a part of an analog integrated circuit that is additionally provided with the comparator circuitry for compensating for parameter variations of the analog integrated circuit. For example, in analog filter circuits the capacitances and the resistances may vary up to 50% due to tolerances in the manufacturing process and/or temperature variations during operation. To precisely adjust the current filter response to the desired design value, the actual RC time constant has to be determined by means of, for example, an on-chip comparator circuitry comparing a rising voltage with two threshold voltages (this type of comparator circuit is also referred to as a window comparator), so as to readjust the filter circuit to the required design value.

In view of the above problems, a need exists for an improved comparator circuit capable of performing a single slope measurement with high precision.

SUMMARY OF THE INVENTION

According to one embodiment, a comparator circuit for time-critical applications in which an amplitude of an input signal crosses a first threshold voltage and a second threshold voltage, comprises comparator means having a first input terminal receiving the input signal, a second input terminal and an output terminal. The comparator circuit further comprises switching means having a first switch input receiving the first threshold voltage, a second switch input receiving the second threshold voltage, a switch output connected to the second input terminal of the comparator means, and a switch control input, wherein the switching means connects the first switch input with the switch output upon receipt of a first control signal at the switch control input, and connects the second switch input with the switch output upon receipt of a second control signal at the switch control input. Moreover, the comparator circuit comprises control means having a reset input receiving a reset signal, a trigger input connected to the output terminal of the comparator means and a control output connected to the switch control input, wherein the control means supplies the first control signal to the switch control input upon receipt of the reset signal, and wherein the control means supplies the second control signal to the switch control input upon receipt of one of a rising edge and a falling edge of a signal at the trigger input that is provided by the output terminal of the comparator means.

According to a further embodiment method of determining a time interval in which an input signal changes its amplitude between a first threshold voltage and a second threshold voltage is provided. The method comprises supplying the input signal to a first input of a comparator, and supplying the first threshold voltage to a second input of the comparator, wherein the comparator changes its output state when the input signal crosses the first threshold voltage. The method also includes supplying, upon the changing of the output state of the comparator, the second threshold voltage to the second input of the comparator such that one of subsequent rising edges and falling edges of the comparator output represent said time interval.

Also contemplated is a comparator circuit having switchable threshold voltages to provide a window function of the comparator. The switch is controlled by a control means, such as a flip-flop, that is inserted as a "digital feedback" means between the comparator output and the switch control input. The control means is triggered by the output of the comparator when the input signal crosses the first threshold voltage to couple the second threshold voltage to the comparator. The comparator, correspondingly reset, can detect the point in time when the input voltage crosses the second threshold voltage with substantially the same rise or fall time. The second detection, i.e., the crossing of the second threshold voltage, sets the output of the comparator with substantially the same delay caused by the meta-stability of the comparator as in the previous detection of crossing the first threshold voltage. Since the delay for setting the comparator output is approximately the same for the first and second detection, the time interval is determined by two subsequent falling and rising edges, respectively, depending on the type of comparator used.

The comparator circuit in accordance with one embodiment may be particularly useful when determining a time interval required to charge a capacitor with a constant current in order to estimate the capacitance of the capacitor.

Moreover, the comparator circuit according to this embodiment may advantageously be employed in combination with a circuit having an inherent RC time constant to determine the RC time constant, which may be caused by tolerances during the fabrication and/or by variations of the environmental conditions during operation of the device, such as temperature, pressure, and/or humidity.

BRIEF DESCRIPTION OF THE DRAWINGS

Further advantages, objects and embodiments objects of the present invention will become more apparent with the appended claims and the following detailed description when taken with reference to the accompanying drawings in which:

FIG. 1b is a timing chart depicting an output signal of a comparator means shown in FIG. 1a;

DETAILED DESCRIPTION

Figure 1A:
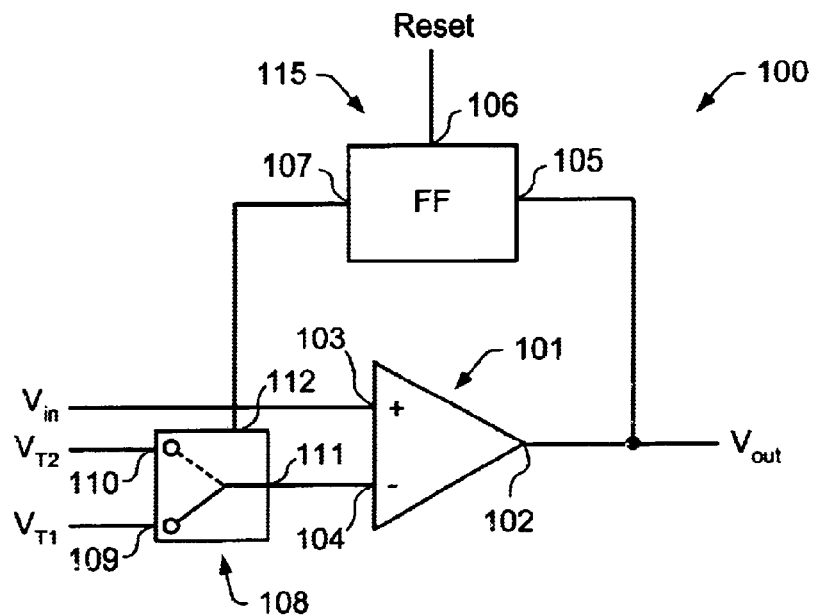
FIG. 1a is a schematic illustrating one embodiment of a circuit.

While the present invention is described with reference to the embodiments as illustrated in the following detailed description as well as in the drawings, it should be understood that the following detailed description as well as the drawings are not intended to limit the present invention to the particular embodiments disclosed, but rather the described embodiments merely exemplify various aspects of the present invention.

FIG. 1a shows one embodiment of a circuit 100. In FIG. 1a, a comparator circuit 100 comprises a comparator means 101, hereinafter simply referred to as comparator, which may be any conventional comparator known in the art. The comparator 101 has an output terminal 102, a first input terminal 103 and a second input terminal 104. A switching means 108 having a first switch input 109, a second switch input 110, a switch output 111 and a switch control input 112 is connected, with its switch output 111, to the second input terminal 104. A control means 115, such as a flip-flop, having a trigger input 105, a reset input 106 and a control output 107 is operatively inserted between the output terminal 102 and the switch control input 112, wherein the trigger input 105 is connected to the output terminal 102 and the control output 107 is connected to the switch control input 112.

In operation, the reset input 106 receives, from an external source (not shown), a reset signal, for example a pulse signal, that enables a first control signal, for example a digital low-level signal, to cause the switching means 108 to connect the first switch input 109 with the switch output 111. A first threshold voltage $V_{T1}$ applied to the first switch input 109 is then supplied to the second input terminal 104 of the comparator 101 in response to the first control signal. The first input terminal of the comparator 101 receives an input signal that may have a rising signal portion with a substantially constant slope. When the rising edge of the input signal crosses the first threshold voltage $V_{T1}$ the output terminal 102 of the comparator 101 will change its output state, for example, from low level to high level, with a time delay that depends on inherent comparator characteristics, such as the meta-stability of the comparator 101. The meta-stability is primarily determined by the input voltage overdrive and the memory effect or charge and discharge time caused by a preceding saturation of the input stage amplifier of the comparator 101.

Figure 1B:

In FIG. 1b, the event when the rising input signal actually crosses the first threshold voltage $V_{T1}$ is indicated by the point in time $t_1$, whereas the point in time of the change of the output terminal 102 is indicated by $t_2$. Consequently, the difference of $t_1$ and $t_2$ amounts to the inherent delay, i.e., the meta-stability, of the comparator 101.

Again referring to FIG. 1a, the rising edge of the comparator's output signal is supplied to the trigger input 105 and causes the control means 115 to emit a second control signal. In the present embodiment the control means 115 is a flip-flop that is set in response to the rising edge of the comparator output signal. The control output 107 then delivers the second control signal, for example a digital high-level signal, to the switch control input 112 to cause the switching means 108 to supply a second threshold voltage, which is applied to the second switch input 110 and which is higher than the first threshold voltage, to the second input terminal 104 of the comparator 101. Since the input signal is now lower than the second threshold voltage; the output terminal 102 of the comparator 101 returns to its initial state, in the present embodiment a low-level state.

In FIG. 1b, the output voltage drop of the comparator 101 to the initial low-level state is indicated by $t_3$, wherein a difference of $t_2$ and $t_3$ represents the entire amount of the signal delay caused by the control means 115, the switching means 108 and the comparator 101. When the input signal reaches the value of the second threshold voltage $V_{T2}$, indicated by $t_4$, the comparator 101 will again change its output state at a point in time indicated by $t_5$ with a time delay caused by the inherent characteristics of the comparator 101 as previously discussed. Since the slope of the input signal between $t_1$ and $t_2$ is selected to be substantially constant, the delays $t_2-t_1$ and $t_5-t_4$ due to the inherent characteristics of the comparator, such as the meta-stability, are substantially equal. As a result, the time interval $\Delta t = t_4 - t_1$ is given by the time interval between the two subsequent rising edges at the output terminal 102 of the comparator 101, wherein the adverse influence of the meta-stability of the comparator 101 is eliminated.

As a result, the comparator circuit 100 according to the embodiment, explained with reference to FIGS. 1a and 1b, allows a single slope measurement with high precision using a minimal number of conventional electronic devices. The detection of the two threshold voltages with the same comparator and the absence of a swap of the threshold input with the signal input eliminates the impact of a DC offset voltage which is introduced by a device mismatch or an input mismatch. Moreover, the comparator circuit, although described with discrete devices, may in a further embodiment be incorporated into an integrated circuit, allowing integration of the comparator circuit with a minimum of chip area and circuit complexity so that the comparator circuit can readily be combined with other circuitries that may require the determination of, for example, inherent capacitances, RC time constants, and the like. Furthermore, in a further embodiment the comparator output signal may be inverted so that a falling edge is used for determining the time interval. Similarly, a falling input signal rather than a rising input signal may be used in combination with a first threshold voltage $V_{T1}$ being higher than the second threshold voltage $V_{T2}$ to obtain the same advantage. Likewise, the first and second control signals, hereinbefore described as a low-level signal and a high-level signal, respectively, may be any signals appropriate for actuating the switching means.

Moreover, in one embodiment, instead of a flip-flop as the control means, any combination of analog devices and/or digital gates, which may be referred to as a state machine, can be used as long as a falling or a rising edge of the comparator's output signal causes the provision of the second control signal.

Figure 2:
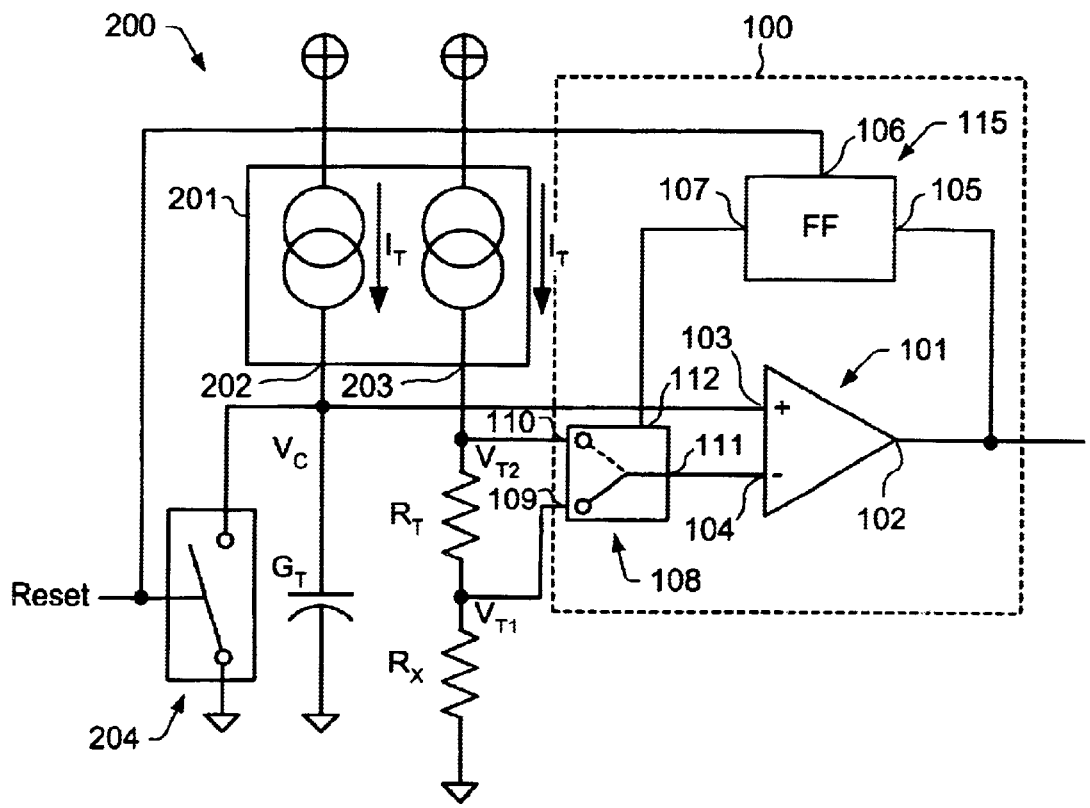
FIG. 2 is a circuit diagram illustrating an embodiment for measuring an RC time constant.
Figure 3:
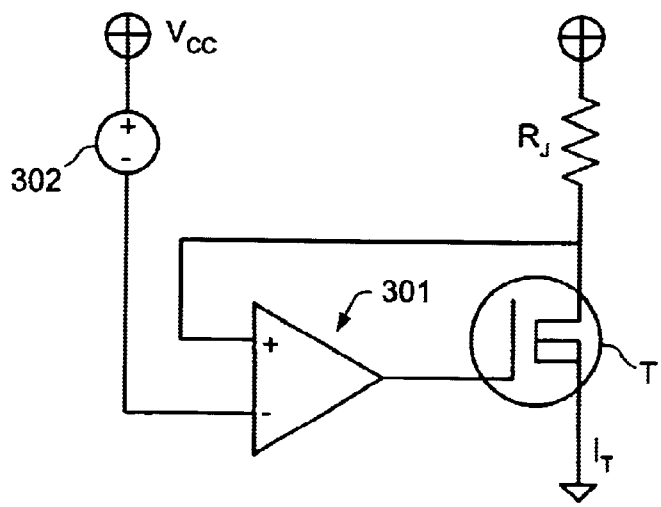
FIG. 3 is a circuit diagram of a portion of a constant current source used in the embodiment of FIG. 2.

With reference to FIGS. 2 and 3 a further embodiment is described in which a comparator circuit as explained above is employed to determine an RC time constant for a capacitor $C_T$ and a resistor $R_T$ of interest.

In FIG. 2, an RC time constant measurement circuit 200 comprises a comparator circuit 100, as described with reference to FIG. 1a. For simplicity all components of the comparator circuit 100 are denoted by the same reference numerals as in FIG. 1a and an explanation thereof is omitted. The RC time constant measurement circuit 200 further comprises a constant current source 201 that provides a current of amount $I_T$ at a first output 202 and at a second output 203. A first electrode of the capacitor $C_T$ is connected to the first output 202, and a second electrode is connected to a reference potential, such as ground potential. The first electrode of the capacitor $C_T$ is also connected to the first input terminal 103. The resistor $R_T$ has a first terminal that is connected to the second output 203 of the constant current source 201 and to the second switch input 110. A second terminal of the resistor $R_T$ is connected to the first switch input 109 and to a first terminal of a resistor $R_X$ a second terminal of which is connected to the reference potential. Moreover, a second switching means 204 having a reset input connected to the reset input 106 of the control means 115 is operatively coupled to the capacitor $C_T$ so as to short the first and second electrodes of the capacitor $C_T$ and to break the short upon receipt of the reset signal.

In operation, application of the reset signal to the second switching means 204 and the control means 115 disconnects the first and the second electrodes of the capacitor $C_T$ from each other and causes the control means 115 to output the first control signal to the switching means 108. The constant current $I_T$ leads to a voltage drop $V_R$ across the resistor $R_T$ and, thus, provides the first and second threshold voltages $V_{T1}$ and $V_{T2}$ according to the relationship: $V_R = V_{T2} - V_{T1}$. The constant current $I_T$ charges the capacitor $C_T$ and the voltage across the capacitor is linearly increasing. A time interval $t_{RC}$ required for charging the capacitor $C_T$ to the voltage $V_R$ is then dependent on the capacitance $C_T$ (for convenience, the capacitor and its capacitance are denoted by the same reference sign) and the constant current $I_T$ according to the equation: $t_{RC} = C_T V_R / I_T$. Substituting the constant current $I_T$ by $V_R/R_T$ yields for $t_{RC}$: $t_{RC} = R_T C_T$.

Hence, the RC time constant of the capacitor $C_T$ and the resistor $R_T$ can be determined by detecting the points in time when the voltage $V_T$ crosses the first threshold voltage $V_{T1}$ and the second threshold voltage $V_{T2}$. The procedure for determining the time interval by means of the comparator circuit 100 may be the same as that described with reference to FIGS. 1a and 1b.

With reference to FIG. 3 the arrangement and the operation of the constant current source 201 is described in more detail.

FIG. 3 is a circuit diagram illustrating a portion of the constant current source 201. A non-inverting input of an operational amplifier 301 having an output coupled to the gate of a transistor T, in this example a p-channel transistor, is connected to one terminal of a reference voltage source 302. The other terminal of the reference voltage source 302 is connected to the positive supply voltage Vcc. One terminal of a resistor $R_I$ is connected to Vcc, and the other terminal of the resistor $R_I$ is connected to the drain of transistor T. The inverting input of the operational amplifier 301 is connected to the drain of transistor T to form a feedback loop, while the source of transistor is connected to the resistor $R_T$ (not shown in FIG. 3) to provide the current $I_T$.

In operation, the reference voltage source 302 may be adjusted to half of the supply voltage Vcc, however, any other value is also appropriate as long as the circuit can work properly. The connection of the source of transistor T with the inverting input of the operational amplifier 301 controls the output and, thus, the transistor T so as to adjust the voltage at the transistor's voltage to be equal to the reference voltage, i.e., Vcc/2 in the present example. Accordingly, the current $I_T$ is defined by the resistor $R_I$ and the reference voltage Vcc/2. To limit the voltage swing at the source of transistor T, which is necessary to drive the current $I_T$ through the resistors $R_T$ and $R_X$ of the RC time constant measurement circuit 200, to Vcc/2, the resistor $R_I$ at least has to be equal to the sum of $R_T$ and $R_X$.

In the present embodiment $R_X$ and $R_I$ are selected to be substantially equal to 2/7 $R_T$ and substantially equal to 9/7 $R_T$, respectively. Thus, the maximum voltage at the second input 104 of the comparator 101, i.e., the source of the transistor T, is equal to Vcc/2 and any possible overdrive of the input amplifier of the comparator 101 may be avoided, thereby reducing a variation of the meta-stability of the comparator, as previously described. Moreover, the constant current source 201 may comprise a second portion that is substantially identical to that shown in FIG. 3 to provide the current $I_T$ to the capacitor $C_T$, or any other conventional constant current source, or a current mirror may additionally be provided.

Furthermore, it should be noted that the resistance value 2/7 $R_T$ for $R_X$ is merely an example and other values may be selected. Since the resistor $R_T$ to be measured is often produced by combining one or more resistor elements the characteristics of which are determined by, for example, process technology, in one particular embodiment $R_X$ is selected such that the magnitude thereof can conveniently be attained by combining a relatively small number of resistor elements to reduce circuit complexity.

In many applications the RC time constant is a critical parameter for an electronic circuit, such as an integrated analog filter circuit, and it may therefore be advantageous to perform an initial RC time constant measurement for adjusting the RC time constant to the specified design value and/or periodically repeat the single slope measurement by means of the RC time constant measurement circuit 200 incorporated into the electronic circuit to monitor possible variations of the RC time constant due to changes of operating conditions, such as temperature, humidity and/or air pressure. An initial measurement of the RC time constant is particularly important in analog integrated circuits, such as filter circuits, having internal capacitors and resistors, since the values of the capacitor and/or the resistor elements may vary in a wide range owing to variations in the fabrication process. When the RC time constant measurement circuit 200 is integrated into the analog circuit, the capacitor $C_T$ and the resistor $R_T$ are manufactured under substantially the same process conditions and represent the corresponding capacitors and resistors of the analog circuit. Alternatively, the RC time constant measurement circuit 200 can include a switch portion that couples a capacitor element and/or a resistor element of the analog circuit to be measured to the comparator circuit whenever an RC time measurement is required so that no "additional" $C_T$ and $R_T$ are required. Moreover, the RC time constant measurement circuit 200 can be powered down during non-measurement intervals to reduce power consumption of the entire circuit.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the present invention.

What is claimed is:

1. A comparator circuit for determining a time interval in which an input signal changes its amplitude between a first threshold voltage and a second threshold voltage, the comparator circuit comprising:

comparator means having a first input terminal receiving the input signal, a second input terminal, and an output terminal;

switching means having a first switch input receiving the first threshold voltage, a second switch input receiving the second threshold voltage, wherein the first and second threshold voltages are independent of the input signal, a switch output connected to the second input terminal of the comparator means, and a switch control input, the switching means connecting the first switch input with the switch output upon receipt of a first control signals at the switch control input, and connecting the second switch input with the switch output upon receipt of a second control signal at the switch control input; and control means having a reset input receiving a reset signal, a trigger input connected to the output terminal of the comparator means, and a control output connected to the switch control input, wherein the control means supplies the first control signal to the switch control input upon receipt of the reset signal, and wherein the control means supplies the second control signal to the switch control input upon receipt of one of a rising edge and a falling edge of a signal at the trigger input that is provided by the comparator means.

2. The comparator circuit of claim 1, wherein the control means is a state machine.

3. The comparator circuit of claim 2, wherein the state machine comprises a flip-flop.

4. The comparator circuit of claim 1, wherein the input signal has a substantially constant slope in an interval of crossing between the first threshold voltage and the second threshold voltage.

5. The comparator circuit of claim 1, wherein the first threshold voltage is less than the second threshold voltage and the input signal comprises a rising edge.

6. The comparator circuit of claim 1, wherein the time interval is determined by two subsequent rising edges of the signal at the output terminal of the comparator means.

7. The comparator circuit of claim 1, wherein the time interval is determined by two subsequent falling edges of the signal at the output terminal of the comparator means.

8. The comparator circuit of claim 1, wherein the first and second threshold voltages are higher than a reference potential of the comparator circuit.

9. The comparator circuit of claim 1, wherein the comparator circuit is an integrated circuit.

10. An integrated circuit including a capacitor having a capacitance C, the capacitor having a first electrode and a second electrode, and a resistor having a resistance R, the resistor having a first terminal and a second terminal, the capacitance C and the resistance R forming a characteristic time constant RC, the integrated circuit comprising an RC determining portion, wherein the RC determining portion includes:

a first switching means connected to short the first and second electrode upon receipt of a reset signal;

a constant current source feeding a constant current to the resistor and to the capacitor;

comparator means having a first input terminal connected to the first electrode, a second input terminal and an output terminal;

second switching means having a first switch input connected to the first terminal, a second switch input connected to the second terminal, a switch output connected to the second input terminal of the comparator means, and a switch control input, the second switching means connecting the first switch input with the switch output upon receipt of a first control signal at the switch control input, and connecting the second switch input with the switch output upon receipt of a second control signal at the switch control input; and control means having a reset input receiving the reset signal, a trigger input connected to the output terminal of the comparator means, and a control output connected to the switch control input, wherein the control means supplies the first control signal to the switch control input upon receipt of the reset signal, and wherein the control means supplies the second control signal to the switch control input upon receipt of one of a rising edge and a falling edge of a signal at the trigger input that is provided by the output terminal of the comparator means such that a time interval between one of subsequent rising edges and subsequent falling edges defines the RC time constant respective the measured time interval.

11. The integrated circuit of claim 10, further comprising a second resistor having a resistance R2 that is a fraction of the resistance R, wherein the second resistor is connected in series with the resistor such that a voltage at the first and second terminals of the resistor is raised with respect to a reference potential of the integrated circuit when the constant current is fed to the resistor.

12. The integrated circuit of claim 10, wherein the constant current source comprises at least one operational amplifier and a resistor element.

13. The integrated circuit of claim 12, wherein the constant current source further comprises at least one output transistor connected to the at least one operational amplifier.

14. The integrated circuit of claim 13, wherein the constant current source comprises one operational amplifier and two output transistors for providing the constant current to the resistor and the capacitor.

15. The integrated circuit of claim 13, wherein the constant current source comprises a current mirror for providing the constant current to the resistor and the capacitor.

16. The integrated circuit of claim 10, further comprising an analog circuit including one or more capacitors having a capacitance substantially equal to C, and one or more resistors having a resistance substantially equal to R.

17. The integrated circuit of claim 16, further comprising a switching portion to connect at least one of the capacitor and the resistor with the analog circuit.

18. A method of determining a time interval in which an input signal changes its amplitude between a first threshold voltage and a second threshold voltage, comprising:

supplying the input signal to a first input of a comparator;

supplying the first threshold voltage to a second input of the comparator, the comparator changing it output state when the input signal crossed the first threshold voltage, wherein the first threshold voltage is independent of the input signal; and supplying, upon the changing of the output state of the comparator, the second threshold voltage to the second input of the comparator, wherein the second threshold voltage is independent of the input signal, such that one of subsequent rising edges and falling edges of the comparator output represent said time interval.

19. The method of claim 18, further comprising supplying the first threshold voltage to the second input of the comparator upon receipt of a reset signal.

20. The method of claim 19, wherein the reset signal is received by a state machine which is connected to the output of the comparator and which is configured to cause one of the first and second threshold voltage to be supplied to the second input of the comparator.

21. The method of claim 20, wherein the state machine actuates a switch to supply one of the first and second threshold voltage to the second input of the comparator.

22. The method of claim 21, wherein the state machine is represented by a flip-flop.

* * * * *